United States Patent [19]
Keeth

[11] Patent Number: 5,910,920
[45] Date of Patent: Jun. 8, 1999

[54] HIGH SPEED INPUT BUFFER

[75] Inventor: Brent Keeth, Boise, Id.

[73] Assignee: Micron Technology, Inc., Boise, Id.

[21] Appl. No.: 08/993,397

[22] Filed: Dec. 18, 1997

Related U.S. Application Data

[63] Continuation of application No. 08/738,529, Oct. 28, 1996.
[51] Int. Cl.$^6$ ................................................ G11C 7/00
[52] U.S. Cl. .................................. 365/189.05; 365/203
[58] Field of Search ........................... 365/189.05, 222, 365/230.08, 203, 205

[56] References Cited

U.S. PATENT DOCUMENTS

| | | | |
|---|---|---|---|
| 4,096,402 | 6/1978 | Schroeder et al. | 307/362 |
| 4,404,474 | 9/1983 | Dingwall | 307/260 |
| 4,638,187 | 1/1987 | Boler et al. | 307/451 |
| 4,789,796 | 12/1988 | Foss | 307/443 |
| 4,958,088 | 9/1990 | Farah-bakhsh et al. | 307/443 |
| 4,984,204 | 1/1991 | Sato et al. | 365/189.11 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hesson | 307/270 |
| 5,179,298 | 1/1993 | Hirano et al. | 307/443 |
| 5,194,765 | 3/1993 | Dunlop et al. | 307/443 |
| 5,220,208 | 6/1993 | Schenck | 307/443 |
| 5,239,206 | 8/1993 | Yanai | 307/272.2 |
| 5,243,703 | 9/1993 | Farmwald et al. | 395/325 |
| 5,254,883 | 10/1993 | Horowitz et al. | 307/443 |
| 5,274,276 | 12/1993 | Casper et al. | 307/443 |
| 5,278,460 | 1/1994 | Casper | 307/296 |
| 5,281,865 | 1/1994 | Yamashita et al. | 307/279 |
| 5,311,481 | 5/1994 | Casper et al. | 365/230.06 |
| 5,321,368 | 6/1994 | Hoelzle | 328/63 |
| 5,347,177 | 9/1994 | Lipp | 307/443 |
| 5,347,179 | 9/1994 | Casper et al. | 307/451 |

(List continued on next page.)

FOREIGN PATENT DOCUMENTS

| | | |
|---|---|---|
| 0 450 871 A2 | 10/1991 | European Pat. Off. . |
| 0 655 741 A2 | 5/1995 | European Pat. Off. . |
| 0 680 049 A2 | 11/1995 | European Pat. Off. . |
| 2-112317 | 4/1990 | Japan . |
| 4-135311 | 8/1992 | Japan . |
| 5-136664 | 1/1993 | Japan . |
| 5-282868 | 10/1993 | Japan . |
| 96/10866 | 4/1996 | WIPO . |

OTHER PUBLICATIONS

Chapman, et al., "A Low–Cost High–Performance CMOS Timing Vernier for ATE", *IEEE International Test Conference*, 459–468, (1995).

Descriptive literature entitled, "400MHz SLDRAM 4M X 16 SLDRAM Pipelined, Eight Bank, 2.5 V Operation," SLDRAM Consortium Advance Sheet, published throughtout the United States, pp. 1–22.

"Draft Standard for a High–Speed Memory Interface (SyncLink)", Microprocessor and Microcomputer Standards Subcommittee of the IEEE Computer Society, Copyright 1996, by the Institute of Electrical and Electronics Engineers, Inc., New York, NY, pp. 1–56.

Ljuslin, et al., "An Integrated 16–Channel CMOS Time to Digital Converter", *Nuclear Science Symposium & Medical Imaging Conference vol. 1*, IEEE Conference Record, 625–629, (1993).

*Primary Examiner*—David Nelms
*Assistant Examiner*—M. Tran
*Attorney, Agent, or Firm*—Seed and Berry LLP

[57] ABSTRACT

A data bus is described which has integrated circuits, such as memory circuits, coupled thereto. The integrated circuits include an input buffer circuit adapted to receive and latch high speed data transmissions. The input buffer circuit equilibrates a sensing circuit, samples input data, senses the sampled input data, and latches the sensed data during different phases of an input clock cycle. An input buffer circuit is described which has two receiver circuits for receiving data transmissions having a higher speed data transmissions.

20 Claims, 7 Drawing Sheets

U.S. PATENT DOCUMENTS

| | | | |
|---|---|---|---|
| 5,355,391 | 10/1994 | Horowitz et al. | 375/36 |
| 5,361,002 | 11/1994 | Casper | 327/530 |
| 5,381,364 | 1/1995 | Chern et al. | 365/145 |
| 5,400,283 | 3/1995 | Raad | 365/203 |
| 5,432,823 | 7/1995 | Gasbarro et al. | 375/356 |
| 5,438,545 | 8/1995 | Sim | 365/189.05 |
| 5,440,260 | 8/1995 | Hayashi et al. | 327/278 |
| 5,451,898 | 9/1995 | Johnson | 327/563 |
| 5,457,407 | 10/1995 | Shu et al. | 326/30 |
| 5,485,490 | 1/1996 | Leung et al. | 375/371 |
| 5,488,321 | 1/1996 | Johnson | 327/66 |
| 5,497,127 | 3/1996 | Sauer | 331/17 |
| 5,498,990 | 3/1996 | Leung et al. | 327/323 |
| 5,513,327 | 4/1996 | Farnwald et al. | 395/309 |
| 5,568,077 | 10/1996 | Sato et al. | 327/199 |
| 5,574,698 | 11/1996 | Raad | 365/230.06 |
| 5,576,645 | 11/1996 | Farwell | 327/94 |
| 5,578,941 | 11/1996 | Sher et al. | 326/34 |
| 5,581,197 | 12/1996 | Motley et al. | 326/30 |
| 5,589,788 | 12/1996 | Goto | 327/276 |
| 5,621,340 | 4/1997 | Lee et al. | 327/65 |
| 5,627,780 | 5/1997 | Malhi | 365/185.09 |
| 5,684,749 | 11/1997 | Seyyedy et al. | 365/203 |
| 5,694,065 | 12/1997 | Hamasaki et al. | 327/108 |

HIGH SPEED INPUT BUFFER

This application is a continuation of U.S. patent application Ser. No. 08/738,529, filed Oct. 28, 1996.

TECHNICAL FIELD OF THE INVENTION

The present invention relates generally to integrated circuits and in particular the present invention relates to data input buffers capable of receiving high speed data transmissions.

BACKGROUND OF THE INVENTION

Integrated circuits typically include a number of input/output pins which are used for communication with additional circuitry. For example, an integrated memory device such as a dynamic random access memory (DRAM) includes both control inputs for receiving memory operation control signals, and data pins for bi-directional data communication with an external system or processor.

The data transmission rate of modern integrated circuits is primarily limited by internal circuitry operating speeds. That is, communication networks have been developed which can transmit signals between circuitry at a rate that is faster than the capacity of many integrated circuits. To address the need for faster circuits, a group of integrated circuits can be combined on a common bus. In this configuration, each integrated circuit operates in a coordinated manner with the other integrated circuits to share data which is transmitted at a high speed. For example, a group of memory devices, such as DRAMs, static RAMs, or read only memories (ROM), can be connected to a common data bus. The data rate of the bus may be substantially faster than the feasible operating speed of the individual memories. Each memory, therefore, is operated so that while one memory is processing received data, another memory is receiving new data. By providing an appropriate number of memory devices and an efficient control system, very high speed data transmissions can be achieved.

As the transmission rate of the data communication signals continues to increase, new circuitry and methods are needed to accurately receive data at each integrated circuit. One proposed solution is a bus interface described in U.S. Pat. No. 5,513,327. This bus interface uses two edge triggered receivers to latch data. The first receiver operates in response to a rising edge of a clock signal while the second receiver operates in response to the falling edge of the clock. Further, the data bus is not terminated at a midsupply level and output is transmitted on the bus using an open drain configuration.

For the reasons stated above, and for other reasons stated below which will become apparent to those skilled in the art upon reading and understanding the present specification, there is a need in the art for a high speed input buffer which can operate independently, or in combination with another input buffer, to receive data in response to a transition of a bus clock.

SUMMARY OF THE INVENTION

The above mentioned problems with integrated circuit data transmission and other problems are addressed by the present invention and which will be understood by reading and studying the following specification. An input buffer circuit is described which equilibrates, samples, senses and latches data signals on each clock signal.

In particular, the present invention describes an input buffer circuit adapted to be coupled to a high speed data bus. The input buffer circuit comprises a differential sense amplifier circuit selectively coupled to a data input node and a data bus termination voltage. An equilibration circuit is connected to the differential sense amplifier circuit and the data bus termination voltage for equilibrating the differential sense amplifier circuit to the data bus termination voltage in response to an equilibrate signal. Coupling circuitry is provided for selectively coupling the data input node and the data bus termination voltage to the differential sense amplifier circuit in response to a sample signal. The input buffer further includes a sense amplifier activation circuitry for activating the differential sense amplifier circuit in response to a sense signal. A latch circuit is coupled to the differential sense amplifier circuit. The latch circuit is adapted to latch a data state of the differential sense amplifier circuit in response to a latch

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
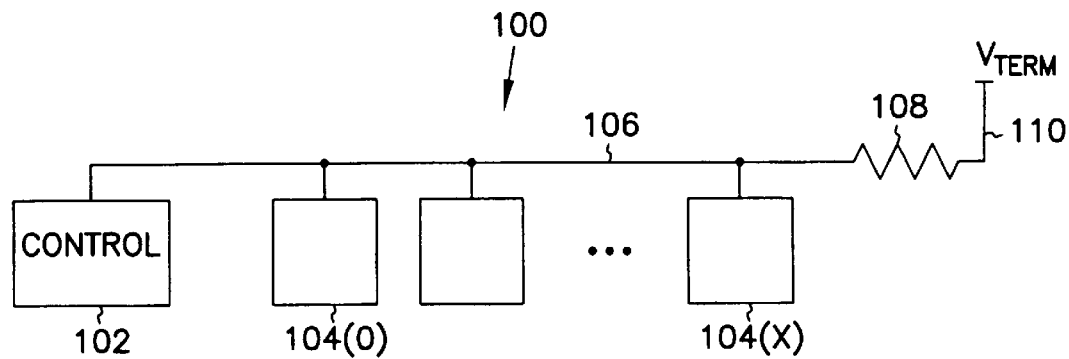
FIG. 1 is a diagram of a memory bus.

FIG. 1 is a simplified illustration of a memory bus 100 which includes a control circuit 102 to provide control and data signals to a number of integrated circuits 104(0)–104(x) via a plurality of communication lines 106. The communication lines are terminated with an appropriate termination circuit 108 (generally illustrated as a resistor) coupled to a termination voltage (Vterm).

Figure 2:
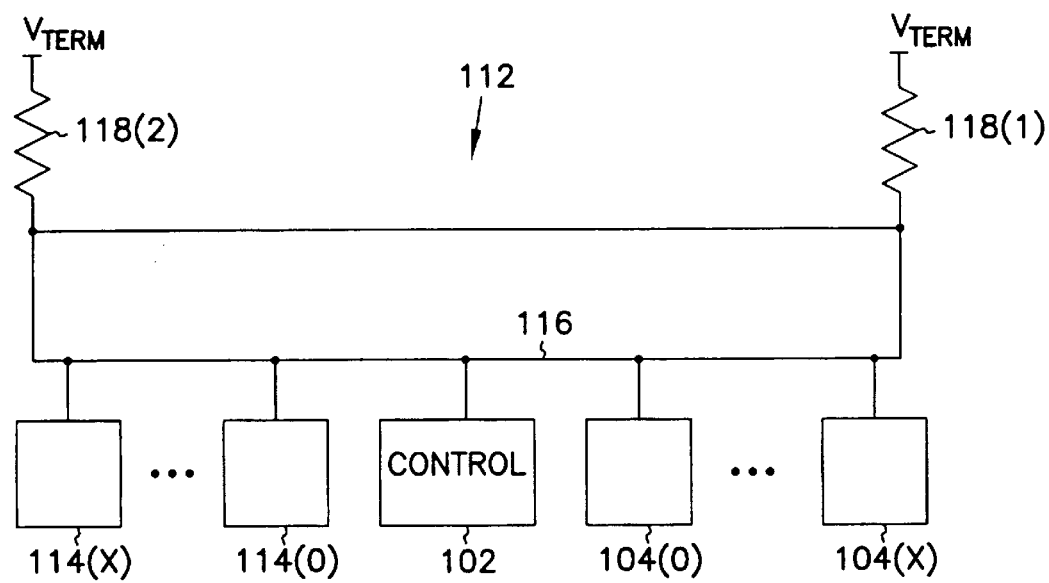
FIG. 2 is a diagram of an alternate memory bus.

FIG. 2 is a simplified illustration of a memory bus 112 which includes a centrally located control circuit 102 to provide control and data signals to a number of integrated circuits 104(0)–104(x), and 114(0)–114(x) via a plurality of communication lines 116. The communication lines are terminated at both ends with an appropriate termination circuit 118(1) and 118(2) (generally illustrated as a resistor) coupled to a termination voltage (Vterm). The preferred value of Vterm is ½(Vdd–Vss), but can be any mid-supply level.

Figure 3:
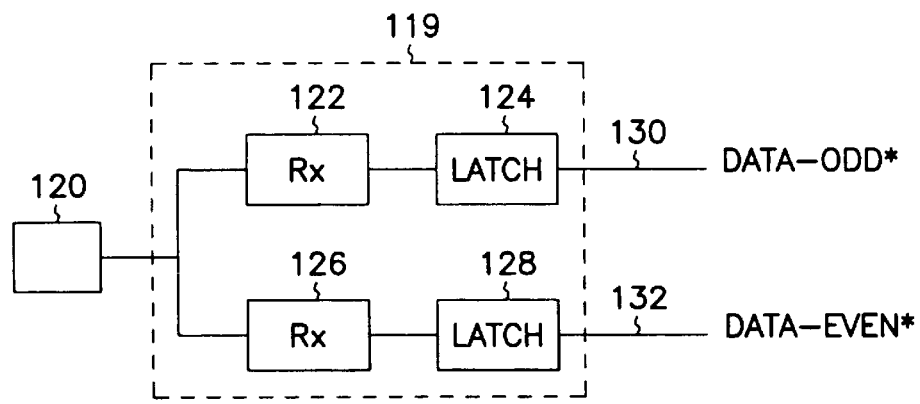
FIG. 3 is a block diagram of a dual receiver input buffer circuit.

FIG. 3 is a block diagram of an input buffer 119 connected to a data input 120. The buffer includes two receivers circuits 122 and 126 connected in parallel and two latch circuits 124 and 128. Each latch circuit produces a data output on either node 130 (Data-odd*) or node 132 (Data-even*). The receivers operate off different phases of a common data clock signal provided on a bus line. The receivers, therefore, are not edge triggered, but are controlled using internal vernier delays. The vernier delays are adjusted at system startup to maximize valid data receipt. That is, the delays are adjusted so that data sampling is conducted when valid data is present and not limited to an edge transition of a clock signal. The dual receiver input buffer illustrated can be used for high speed data communication in the range of 800+ mega bits per second. For slower data communication rates, such as 400 mega bits per second, a single receiver and latch circuit can be used in the input buffer.

Figure 4:
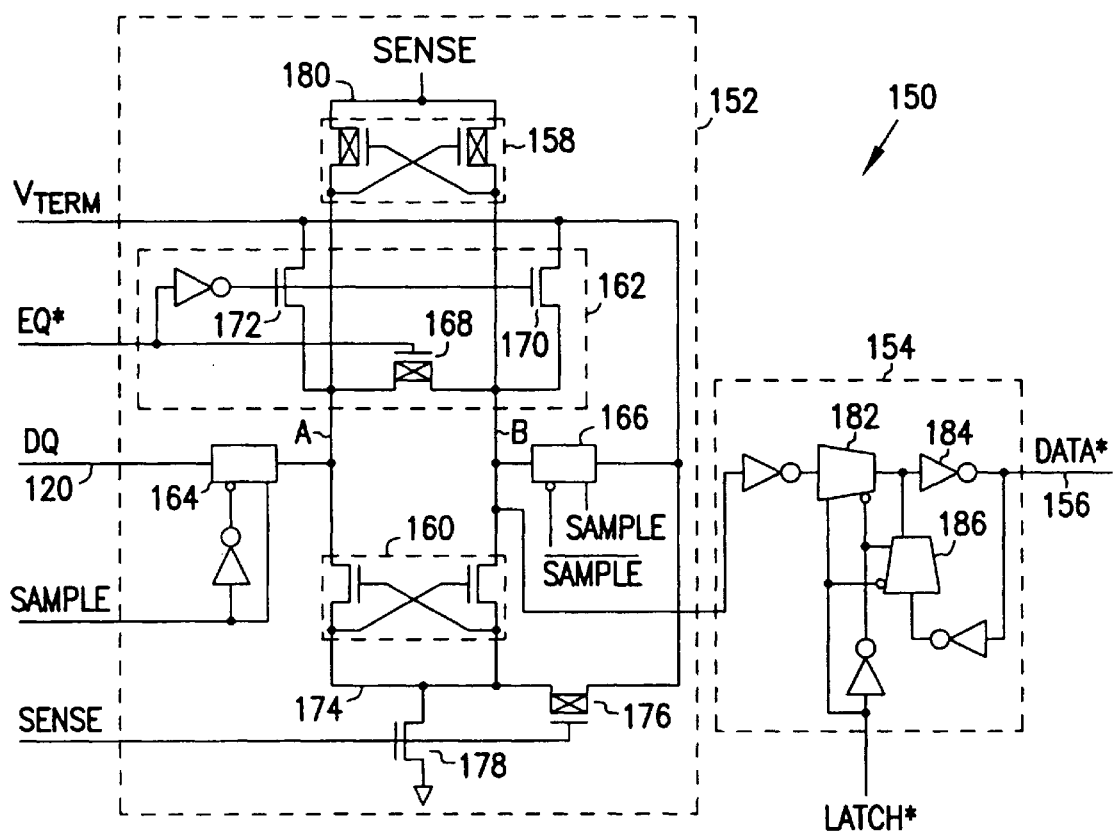
FIG. 4 is a schematic diagram of a single receiver high speed input buffer.

Referring to FIG. 4, a high speed input buffer 150 is described which uses a receiver 152 and a latch circuit 154 to produce an internal data signal (Data) on output 156. The receiver 152 circuit operates in response to internal signals which are based upon different phases of a common clock signal provided on a bus coupled to other integrated circuits. The internal signals are an equilibrate signal (EQ*), a sense signal (Sense), and a sample signal (Sample). The receiver is connected to the bus termination voltage (Vterm) and is connected to the bus data line through data input connection 120.

The receiver 152 is comprised of a p-type sense amplifier circuit 158 having a pair of cross coupled p-type transistors, and an n-type sense amplifier 160 having a pair of cross coupled n-type transistors. An equilibrate circuit 162 is provided to equilibrate the common nodes of the sense amplifiers (nodes A and B) to Vterm. Coupling circuitry 164 and 166 is provided to selectively couple node 120 and Vterm to nodes A and B, respectively, in response to the Sample signal. To better understand the operation of the input buffer, reference is made to the timing diagram of FIG. 5.

Figure 5:
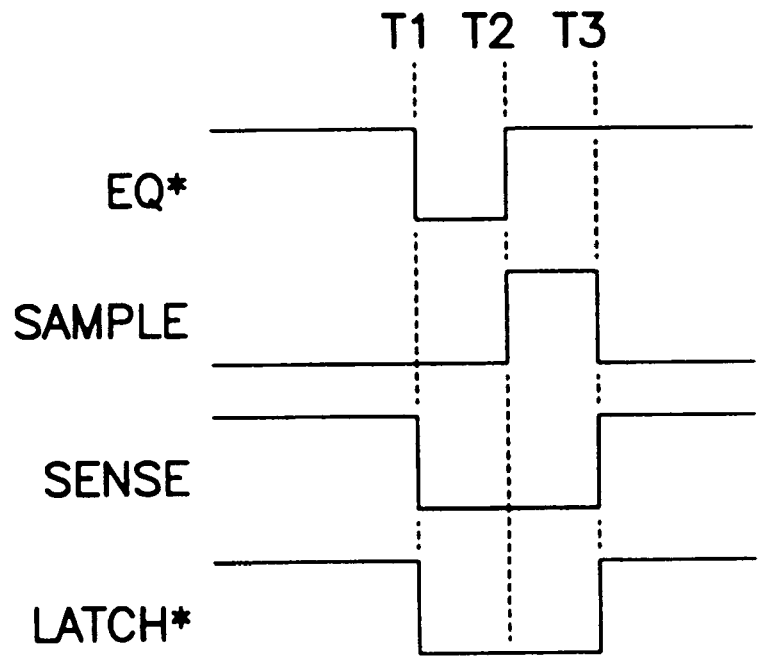
FIG. 5 is a timing diagram of the operation of the input buffer of FIG. 4.

As illustrated in FIG. 5, the equilibrate signal (EQ*) transitions low at time t1 to activate transistors 168, 170 and 172 of the equilibrate circuit 162. Transistors 170 and 172 couple nodes B and A, respectively, to the termination voltage, Vterm. The sense amplifiers, therefore, are equilibrated to the bus termination voltage. At time t2, the equilibration circuitry is deactivated, and the Sample signal transitions high and activates coupling circuit 164 to couple input 120 to node A. Couple circuit 166, likewise, is activated to couple node B to the termination voltage, Vterm. With the Sense signal low at time t2, node 180 of the p-sense amplifier circuit 158 is coupled low, and node 174 of the n-sense amplifier is coupled to Vterm through transistor 176. At time t3, the Sense signal transitions high to activate transistor 178 and couple node 174 to ground. The Sample signal transitions low to isolate nodes A and B such that p-sense amplifier and n-sense amplifier amplify nodes A and B to an appropriate voltage level. The Latch* signal transitions high at time t3 to activate latch circuit 154. Thus, coupling circuit 182 is activated to couple the inverse of node B to inverter circuit 184. When the Latch* signal returns to a low state, circuit 182 is deactivated and circuit 186 is activated to latch inverter 184. Although the latch is connected to node B, latch circuit 154 can be coupled to node A and is not intended to limited the present invention. It will be understood by those skilled in the art that the signals illustrated in FIG. 5 are internally generated in response to an externally received clock signal. Thus, the input data buffer is operated off different phases of the clock signal.

Figure 6:
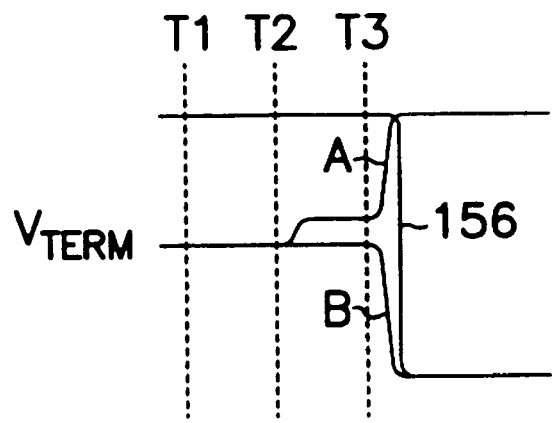
FIG. 6 is a timing diagram of select voltages of the input buffer of FIG. 4.

FIG. 6 illustrates the voltages on nodes A and B and the output node 156 upon receipt of a high input data signal. At time t1 Nodes A and B are equilibrated to Vterm. At time t2, node A is coupled to input 120 and increases in voltage. At time t3, the sense amplifier circuitry is activated and nodes A and B are amplified. At the same time, node B is coupled to the latch circuit and the output data signal on 156 is coupled to node B.

Figure 7:
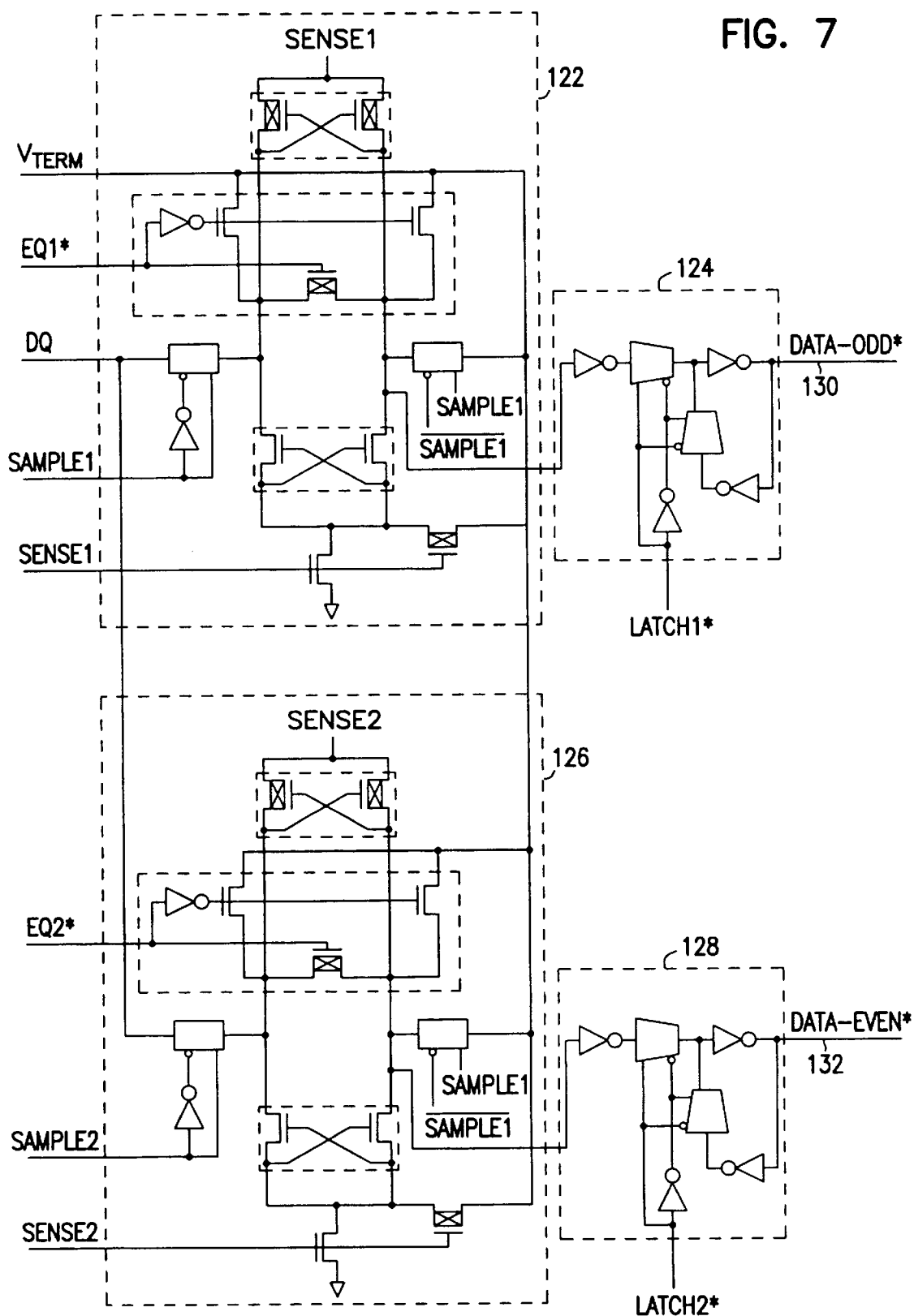
FIG. 7 is a schematic diagram of an alternate high speed input buffer.
Figure 8A:
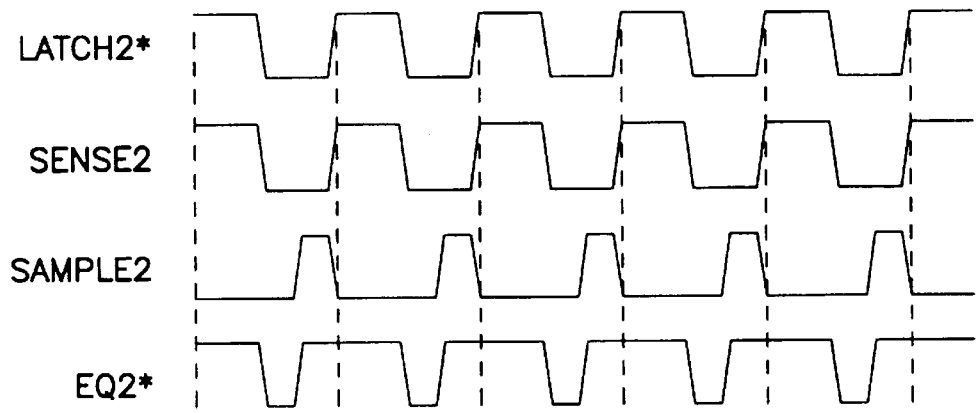
FIGS. 8 A, B and C is a timing diagram of the operation of the input buffer of FIG. 7.
Figure 8B:
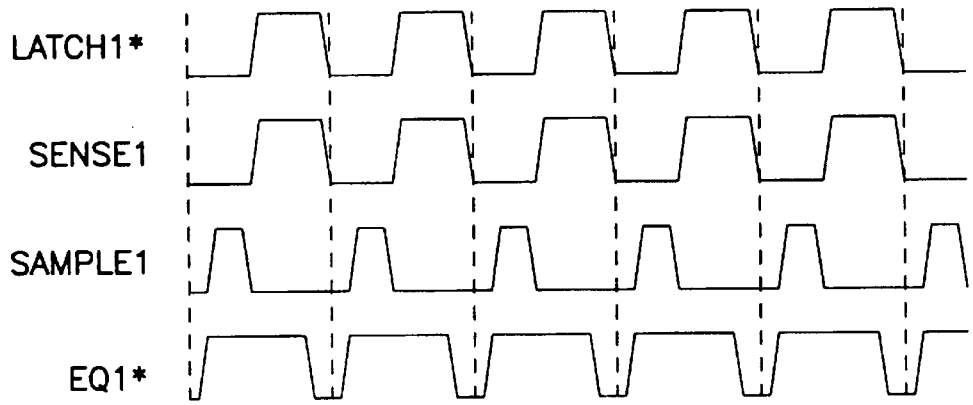
Figure 8C:
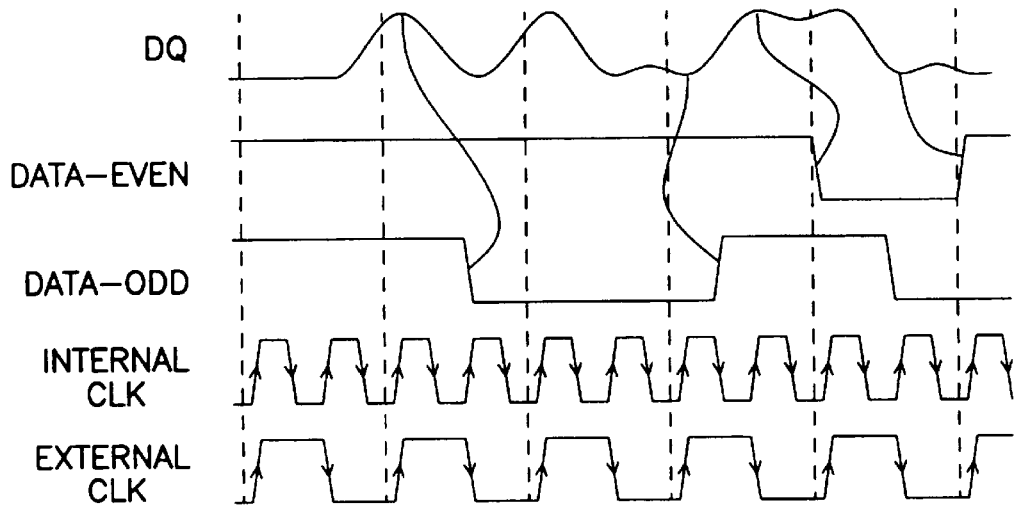

FIG. 7 is a schematic diagram of a high speed input buffer having two parallel receivers 122 and 126, and two latch circuits 124 and 128, as illustrated in FIG. 3. The receivers 122 and 126 generally include the circuitry of receiver 152 and operate in a similar manner, as described above with reference to FIG. 4. The timing diagram of FIGS. 8A, 8B and 8C illustrate the operation of the high speed input buffer of FIG. 7. The data signal provide on the DQ line is sampled by both receivers 122 and 126 on the rising edge of their respective sample signals. The DQ line, therefore, is sampled by both receiver circuits. The outputs (Data-even* and Data-odd*) together represent the data provided on the DQ line. The external bus clock signal and an internal clock signal operating at twice the frequency of the external clock are illustrated. The equilibrate signals (EQ1* and EQ2*) are substantially aligned with the clock signals. As such the external clock signal can be defined logically as being equal to ½(EQ1* AND EQ2*). The sample signals are timed using the vernier delay circuit to sample the DQ line when the data signals are at a signal peak.

Figure 9:
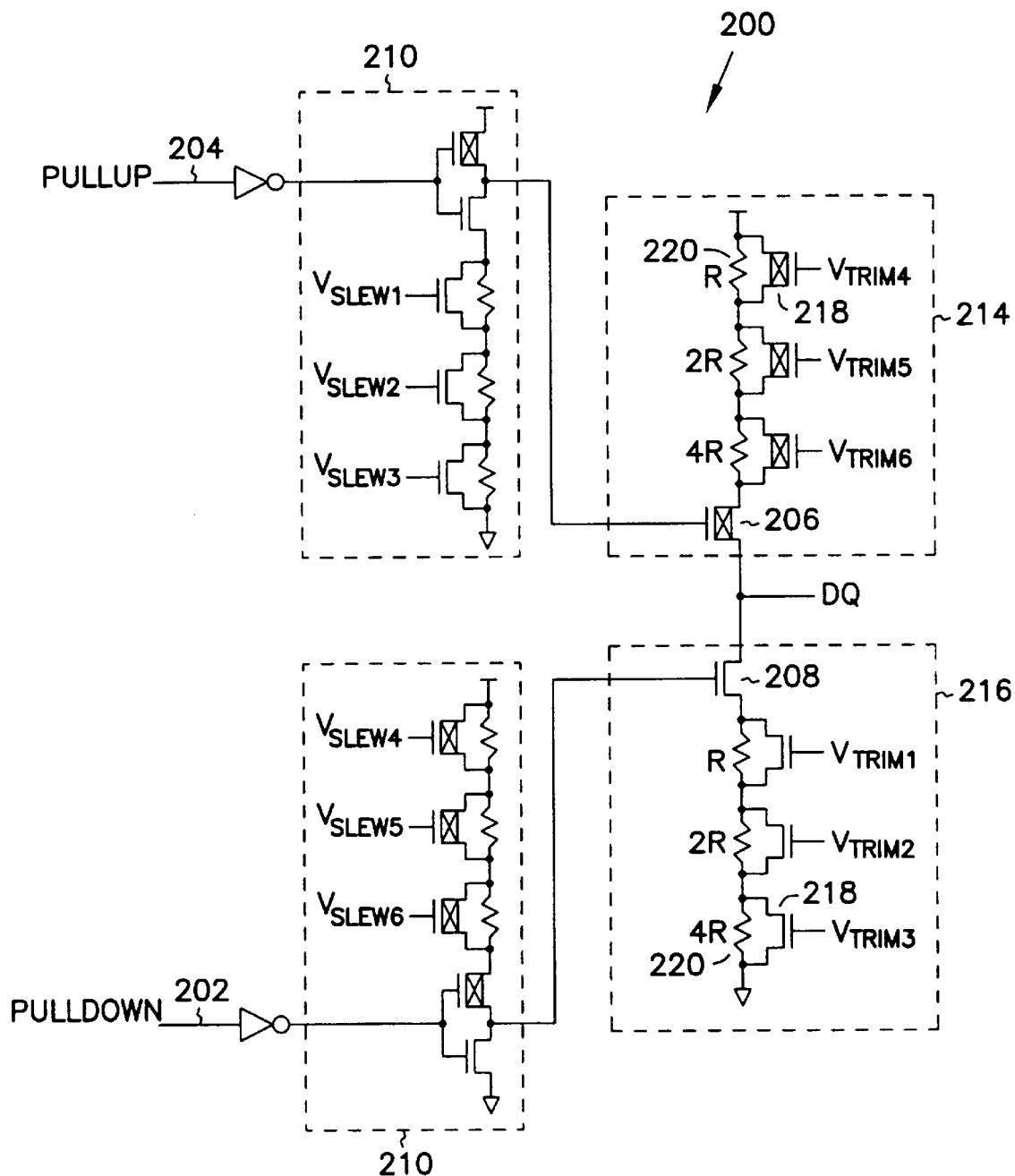
FIG. 9 is a schematic diagram of an output driver circuit.

FIG. 9 is a schematic diagram of a push/pull output driver 200 connected to the data output connections (DQ) of the integrated circuit. Pullup and pulldown signals are respectively provided on nodes 202 and 204 to activate either pullup transistor 206, or pulldown transistor 208. The driver circuit is provided with optional slew rate control circuits 210. These control circuits can be adjusted using Vslew signals to selectively activate a series of transistors. That is, by activating any of the transistors the parallel resistor is bypassed and the response time of the circuit is changed. Thus, the activation timing of transistors 206 and 208 can be adjusted.

Pullup drive adjust circuit 214 is provide in the output driver circuit 200 to adjust the voltage coupled to pullup transistor 206. Likewise, pulldown drive adjust circuit 216 is provide in the output driver circuit 200 to adjust the voltage coupled to pulldown transistor 206. In operation, the gates of transistors 218 are selectively activated to bypass resistors 220. Adjusting the output driver circuit is conducted after an integrated circuit has been installed on a bus. That is, the output driver voltages can be adjusted to match the requirements of a specific bus system. Et will be appreciated by those skilled in the art that the slew rate control circuits can be eliminated without departing from the present invention.

Figure 10:
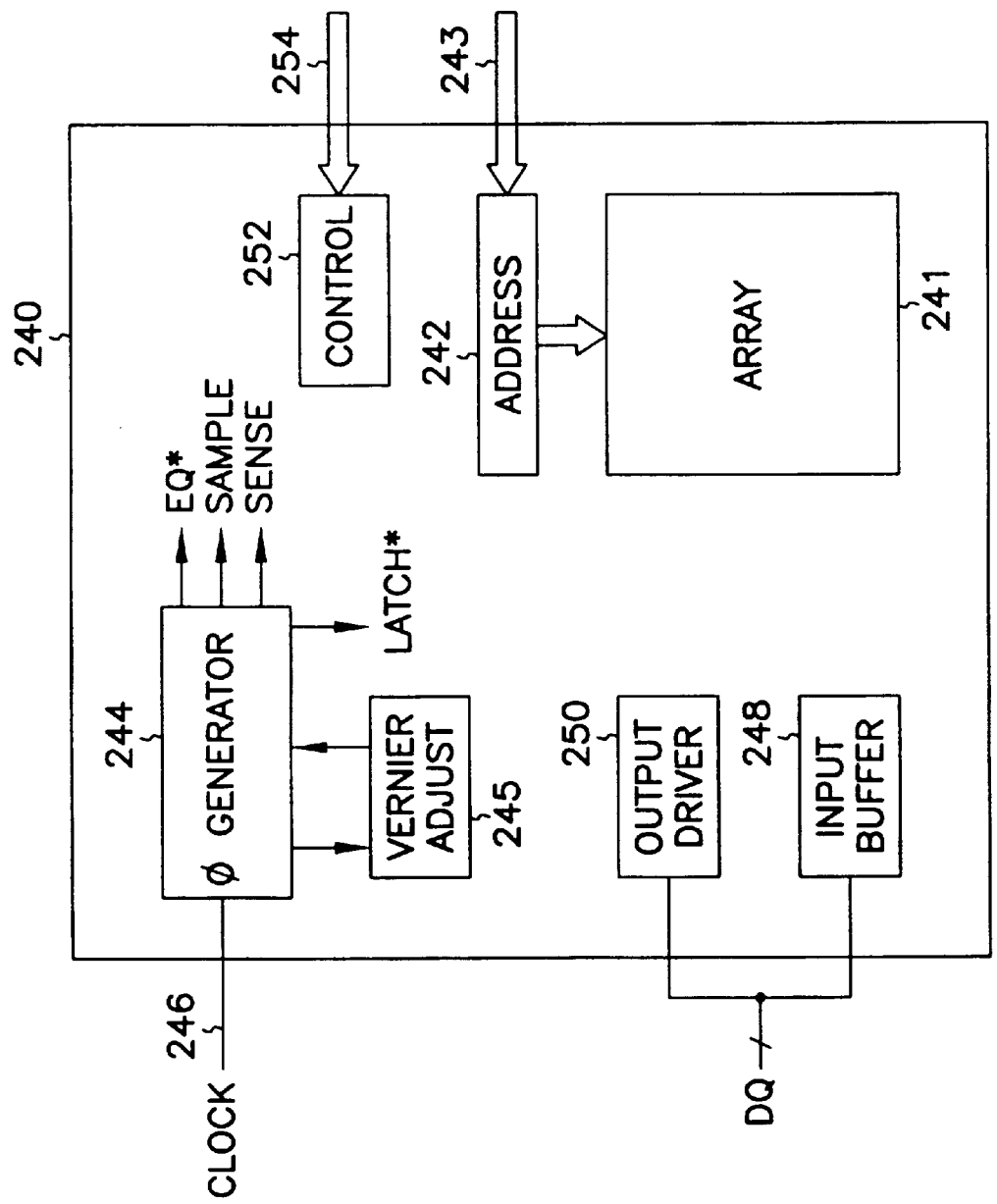
FIG. 10 is a block diagram of a memory device incorporating a high speed input buffer.

FIG. 10 is a block diagram of a dynamic random access memory device 240 (DRAM) incorporating a high speed input buffer 248, as described above. The memory includes address circuitry 242 for accessing a memory array 241 in response to address signals provided on input lines 243. Control circuitry 252 is provided for controlling the read and write operations of the memory in response to control signals 254. A phase generator circuit 244 is provided to generate internal signals DQ*, Sample, Sense, and Latch* for the input buffer circuit. Vernier adjust circuit 245 is coupled to the phase generator for adjusting the timing of the internal signals. It will be understood that the input buffer circuit 248 includes a high speed input buffer circuit as described above for each data line, DQ. Output driver circuitry 250 is provided to drive an appropriate output signal on the DQ lines. Although the illustrative example of FIG. 10 is a DRAM, the high speed input buffer circuitry of the present invention can be included in any integrated circuit device, such as SRAM and ROM memory devices.

CONCLUSION

An integrated circuit input buffer circuit is described which uses a receiver circuit and a latch to sample and latch a data signal. The buffer is operated in response to internal signals generated at different phases of an externally provided clock signal. The input buffer can include two receiver circuits and two latch circuits for use on a data bus operating at higher transmission rates. The receiver circuit includes a sensing circuit for sensing an input data signal, an equilibrate circuit for equilibrating the sensing circuit, and an sense activation circuit for activating the sensing circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An input buffer circuit adapted to be coupled to a high speed data bus, the input buffer circuit comprising:
    a differential sense amplifier circuit selectively coupled to a data input and an internal output node that is adapted to be selectively coupled to a pre-selected voltage level that is a termination voltage of the high speed data bus;
    an equilibration circuit connected to the differential sense amplifier circuit for equilibrating the differential sense amplifier circuit in response to an equilibrate signal;
    isolation circuitry for selectively isolating the data input node from the differential sense amplifier circuit in response to a sample signal; and
    sense amplifier activation circuitry for activating the differential sense amplifier circuit in response to a sense signal is a termination voltage of the high speed data bus.

2. An input buffer circuit adapted to be coupled to a high speed data bus, the input buffer circuit comprising:
    a differential sense amplifier circuit selectively coupled to a data input and an internal output node;
    an equilibration circuit connected to the differential sense amplifier circuit for selectively equilibrating the differential sense amplifier circuit to a pre-selected bias voltage level in response to an equilibrate signal;
    isolation circuitry for selectively isolating the data input node from the differential sense amplifier circuit in response to a sample signal; and
    sense amplifier activation circuitry for activating the differential sense amplifier circuit in response to a sense signal.

3. The input buffer circuit of claim 2 wherein the pre-selected bias voltage level is a termination voltage of the high speed data bus.

4. An integrated circuit containing an input buffer circuit adapted to be coupled to a high speed data bus, the integrated circuit comprising:
    a differential sense amplifier circuit selectively coupled to a data input and an internal output node;
    an equilibration circuit connected to the differential sense amplifier circuit for equilibrating the differential sense amplifier circuit in response to an equilibrate signal;
    isolation circuitry for selectively isolating the data input node from the differential sense amplifier circuit in response to a sample signal;
    sense amplifier activation circuitry for activating the differential sense amplifier circuit in response to a sense signal; and
    a clock input node for receiving an externally provided clock signal; and a phase generation circuit connected to the clock input node, the phase generation circuit producing the equilibrate signal, the sample signal, the sense signal and the latch signal.

5. The integrated circuit of claim 4 wherein the integrated circuit is a dynamic random access memory (DRAM).

6. An integrated circuit comprising an input buffer adapted to be coupled to a high speed data bus for receiving an analog data signal, the input buffer circuit comprising:
    a clock input node for receiving an externally provided clock signal;
    a phase generation circuit connected to the clock input node, the phase generation circuit producing internal control signals;
    first and second receiver circuits selectively coupled to the high speed data bus for alternately decoding the analog data signal in response to the control signals, each receiver circuit comprising:
        a differential sense amplifier circuit selectively coupled to a data input and an internal output node;
        an equilibration circuit connected to the differential sense amplifier circuit for equilibrating the differential sense amplifier circuit in response to an equilibrate signal;
        isolation circuitry for selectively isolating the data input node from the differential sense amplifier circuit in response to a sample signal; and
        sense amplifier activation circuitry for activating the differential sense amplifier circuit in response to a sense signal.

7. The integrated circuit of claim 6 further comprising:
    a first latch circuit coupled to the differential sense amplifier circuit of the first receiver circuit, the first latch circuit adapted to latch a data state of the first receiver circuit in response to a latch signal; and
    a second latch circuit coupled to the differential sense amplifier circuit of the second receiver circuit, the second latch circuit adapted to latch a data state of the second receiver circuit in response to a latch signal.

8. The integrated circuit of claim 6 wherein the integrated circuit is a dynamic random access memory (DRAM).

9. The integrated circuit of claim 6 wherein the equilibrate voltage is one-half of the difference between an upper supply voltage (Vdd) and a lower supply voltage (Vss).

10. The integrated circuit of claim 6 further comprising a vernier adjustment circuit for adjusting the phase generation circuit to maximize valid data receipt, such that data sampling is conducted when valid analog data signals are present on the high speed data bus and not limited to an edge transition of the externally provided clock signal.

11. An integrated circuit comprising an input buffer adapted to be coupled to a high speed data bus for receiving an analog data signal, the input buffer circuit comprising:

a clock input node for receiving an externally provided clock signal;

a phase generation circuit connected to the clock input node, the phase generation circuit producing internal control signals;

a plurality of N-buffer circuits selectively coupled to the high speed data bus for alternately decoding the analog data signal in response to the control signals, each of the N-buffer circuits comprising:

a differential sense amplifier circuit selectively coupled to a data input and an internal output node;

an equilibration circuit connected to the differential sense amplifier circuit for equilibrating the differential sense amplifier circuit in response to an equilibrate signal;

isolation circuitry for selectively isolating the data input node from the differential sense amplifier circuit in response to a sample signal; and sense amplifier activation circuitry for activating the differential sense amplifier circuit in response to a sense signal.

12. A method of receiving data with an integrated circuit, the method comprising the steps of:

receiving an analog data signal on a high speed data bus;

receiving an externally provided clock signal;

serially activating a plurality of sense amplifier data buffers during one cycle of the external clock signal to sample and detect data from the analog data signal; and latching the detected data from the plurality of sense amplifier data buffers.

13. The method of claim 12 further comprising the step of:

generating internal control signals from the external clock signal using a phase generator, the control signals comprising equilibrate signals, sample signals, and latch signals.

14. The method of claim 12 further comprising the step of:

adjusting the phase generator using a vernier adjust circuit to maximize valid data receipt, such that data sampling is conducted when valid analog data signals are present on the high speed data bus and not limited to an edge transition of the externally provided clock signal.

15. The method of claim 12 wherein the plurality of sense amplifier data buffers each comprise:

a differential sense amplifier circuit selectively coupled to the high speed data bus and an internal output node;

an equilibration circuit connected to the differential sense amplifier circuit for equilibrating the differential sense amplifier circuit in response to an equilibrate signal;

isolation circuitry for selectively isolating the high speed data bus from the differential sense amplifier circuit in response to a sample signal; and sense amplifier activation circuitry for activating the differential sense amplifier circuit in response to a sense signal.

16. The method of claim 12 further comprising the step of:

equilibrating the sense amplifier data buffers prior to sampling data from the high speed data bus.

17. The method of claim 16 further wherein the sense amplifier data buffers are equilibrated to a predetermined bias voltage.

18. A method of detecting data from a signal on a high speed data bus using first and second data buffers, the method comprising the steps in the order of:

sampling the signal using the first data buffer;

equilibrating the second data buffer and sensing data sampled by the first data buffer;

sampling the signal using the second data buffer; and equilibrating the first data buffer and sensing data sampled by the second data buffer.

19. The method of claim 18 wherein the steps of sampling the first and second data buffers are performed in a time period substantially equal to a clock cycle of an externally provided clock.

20. The method of claim 18 wherein the steps of sampling the first and second data buffers are adjusted whereby sample times correspond to maximum and minimum signal levels of the signal on the high speed data bus.

* * * * *

UNITED STATES PATENT AND TRADEMARK OFFICE
CERTIFICATE OF CORRECTION

PATENT NO.   : 5,910,920
DATE         : June 8, 1999
INVENTORS    : Brent Keeth

It is hereby certified that error appears in the above-identified patent and that said Letters Patent are hereby corrected as shown below:

Column 4, line 58      reads, "Et will" should read - - It will - -

Signed and Sealed this

Twenty-second Day of May, 2001

Attest:

NICHOLAS P. GODICI

Attesting Officer      Acting Director of the United States Patent and Trademark Office